United States Patent
Ono et al.

(10) Patent No.: US 7,150,095 B2
(45) Date of Patent: Dec. 19, 2006

(54) METHOD FOR MANUFACTURING PROBE NEEDLE, METHOD FOR MANUFACTURING PROBE CARD, AND PROBE CARD

(75) Inventors: Yasukazu Ono, Kasugai (JP); Motoharu Yakura, Kasugai (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 11/006,762

(22) Filed: Dec. 8, 2004

(65) Prior Publication Data

US 2006/0042077 A1    Mar. 2, 2006

(30) Foreign Application Priority Data

Aug. 31, 2004  (JP)  ............................. 2004-252732
Aug. 31, 2004  (JP)  ............................. 2004-252733

(51) Int. Cl.
*H01B 13/20* (2006.01)
(52) U.S. Cl. .................. 29/828; 29/825; 29/874; 174/75 C
(58) Field of Classification Search ................ 29/828, 29/825, 874, 876, 884, 875; 174/75 C
See application file for complete search history.

(56) References Cited

U.S. PATENT DOCUMENTS 4,776,086 A * 10/1988 Kasevich et al. ............. 29/828

FOREIGN PATENT DOCUMENTS

| JP | 2-50452 | | 2/1990 |
| JP | 03-177038 | * | 8/1991 |
| JP | 03-195974 | * | 8/1991 |
| JP | 8-22463 | | 1/1996 |
| JP | 2003-121462 | * | 4/2003 |
| KR | 2004-0064998 A | | 7/2004 |

OTHER PUBLICATIONS

Notice Requesting Submission of Opinion mailed on Aug. 28, 2006, issued in corresponding Patent Application No. 10-2005-0022742.

* cited by examiner

*Primary Examiner*—Carl J. Arbes
(74) *Attorney, Agent, or Firm*—Westerman, Hattori, Daniels & Adrian, LLP.

(57) ABSTRACT

A probe needle having a coaxial structure that facilitates assembly of a probe card. The probe needle is manufactured by covering a central conductive body with an insulative tube, and forming a conductive layer around the insulative tube by superimposing a film of fine conductive grains around the insulative tube.

7 Claims, 7 Drawing Sheets

METHOD FOR MANUFACTURING PROBE NEEDLE, METHOD FOR MANUFACTURING PROBE CARD, AND PROBE CARD

CROSS-REFERENCE TO RELATED APPLICATIONS

This application is based upon and claims the benefit of priority from prior Japanese Patent Application Nos. 2004-252732 and 2004-252733, both filed on Aug. 31, 2004, the entire contents of which are incorporated herein by reference.

BACKGROUND OF THE INVENTION

The present invention relates to a probe card used when inspecting a semiconductor device.

A probe card having probe needles is used to inspect a semiconductor device. Due to the miniaturization and high integration of recent semiconductor devices, the distance between bonding pads or inspection pads have become small. Further, the quantity of pads has increased. As a result, the probe needles must be arranged on the probe card in a concentrated manner. Further, to reduce inspection costs, a plurality of semiconductor devices may have to be inspected at the same time with the same probe card. This further increases the quantity of probe needles on the probe card, which, in turn, further increases the concentration of the probe needles. Under such a circumstance, probe needles affect one another when they are closely arranged. This produces noise, such as crosstalk. Accordingly, there is a demand for a probe card and probe needles that suppress the effect of noise without decreasing the concentration of the probe cards.

FIGS. 1 and 2 show a prior art probe card 5 provided with cantilever type probe needles. The probe card 5 includes a disk-shaped substrate 1. A hole extends through the central portion of the substrate 1. The substrate 1 includes a needle seat 3 and a support 4, which is made of synthetic resin and is located inward from the needle seat 3 and around the hole. A plurality of probe needles 2 extend outward in the radial direction from the central portion of the substrate 1.

Each probe needle 2 has a basal portion soldered to the needle seat 3 and a distal portion held by the support 4. The distal portions of the probe needles 2 are concentrated at the central portion of the substrate 1. Each probe needle 2 has a cantilever structure in which it becomes farther from the substrate 1 towards its distal end. Further, each probe needle 2 has a middle portion that is covered by an insulative tube to prevent electric connection with an adjacent probe needle.

To inspect a semiconductor device with the probe card 5, the distal end of each probe needle 2 is pressed against a pad of the semiconductor device.

In the probe card 5, a gap is formed by each probe needle 2 between the needle seat 3 and the support 4. Thus, as the quantity of probe needles increase, closely arranged probe needles affect one another and may pick up noise such as crosstalk. Further, in a probe card that inspects a plurality of semiconductor devices at the same time, the probe needles may be closely arranged to one another in the vertical direction with respect to the surface of the substrate. In this case, the probe needles would pick up even more noise.

Accordingly, such noise may reduce the inspection accuracy. Further, re-inspection may become necessary. This would prolong the inspection time.

To reduce the effect of noise in such probe needles, a probe card having probe needles with coaxial structures has been proposed. A probe needle having a coaxial structure includes a central conductive body, an insulative tube that covers the middle portion of the central conductive body, and a conductive metal tube (outer conductive body) that covers the insulative tube.

The two ends of the outer conductive body are connected to a ground wire on the substrate. Thus, the outer conductive body functions as a shield layer. This reduces the effects of noise.

Japanese Laid-Open Patent Publication Nos. 8-22463 and 2-50452 describe an example of a probe card including probe needles with coaxial structures.

SUMMARY OF THE INVENTION

In a probe needle having a coaxial structure in the prior art, the diameter of the central conductive body is 130 μm or greater and normally 150 μm. Further, the diameter of the insulative tube covering the central conductive body is 170 μm. The outer conductive body increases the diameter of the probe needle by about 200 μm. Thus, the diameter of the outer conductive body is about 370 μm. Accordingly, the coaxial needle has a diameter that is more than two times greater than a normal probe needle covered by an insulative tube.

Accordingly, all of the probe needles cannot have a coaxial structure. Only the probe needles required to be shielded from noise have the coaxial structure.

A probe having the coaxial structure has a large diameter and therefore must be provided with more space than the normal probes. Further, the force that the probe needle of the coaxial structure exerts on a pad differs from that of the normal probe needle due to the difference in diameter. This makes it difficult to manage the needle path.

Since the diameter of the probe needle having the coaxial structure differs greatly from the normal probe, the coaxial probe needle must be attached to the probe card in accordance with an attachment rule that differs from that of the normal card. As a result, the assembly of a probe card including a probe needle having the coaxial structure is difficult.

The present invention provides a probe needle having a coaxial structure that facilitates the assembly of the probe card. Further, the present invention provides a probe card that reduces the effect of noise while facilitating assembly of the probe card.

One aspect of the present invention is a method for manufacturing a probe needle having a coaxial structure. The method includes covering a central conductive body with an insulative tube, and forming a conductive layer around the insulative tube by superimposing a film of fine conductive grains around the insulative tube.

Another aspect of the present invention is a method for manufacturing a probe needle having a coaxial structure. The method includes covering a central conductive body with an insulative tube, and forming a conductive layer around the insulative tube by applying a conductive substance around the insulative tube.

A further aspect of the present invention is a method for manufacturing a probe needle having a coaxial structure. The method includes covering a central conductive body with an insulative tube, and forming a conductive layer around the insulative tube by performing vapor deposition to superimpose a conductive substance around the insulative tube.

Another aspect of the present invention is a method for manufacturing a probe needle having a coaxial structure.

The method includes covering a central conductive body with an insulative tube, and forming a conductive layer around the insulative tube. The forming a conductive layer includes immersing the central conductive body in a first solvent containing a conductive substance, removing the central conductive body from the first solvent, and drying the central conductive body.

A further aspect of the present invention is a method for manufacturing a probe card. The method includes preparing a substrate including a ground wire, preparing a probe needle including a middle portion covered by an insulative tube, mounting the probe needle on the substrate so that the probe needle has a cantilever structure, and arranging a conductive material, connected to the ground wire, on the middle portion of the probe needle.

Another aspect of the present invention is a method for manufacturing a probe card. The method includes preparing a substrate including a ground wire, preparing a probe needle including a middle portion covered by an insulative tube, mounting the probe needle on the substrate so that the probe needle has a cantilever structure, applying a conductive adhesive to the middle portion of the probe needle so that the conductive adhesive is connected to the ground wire, and drying the conductive adhesive.

Another aspect of the present invention is a method for manufacturing a probe card. The method includes preparing a substrate including a ground wire, preparing a probe needle including a middle portion covered by an insulative tube, forming a conductive base on the ground wire, and embedding the middle portion of the probe needle in the conductive base so that the probe needle has a cantilever structure.

A further aspect of the present invention is a method for manufacturing a probe card. The method includes preparing a substrate including a ground wire, preparing a probe needle including a middle portion covered by an insulative material, forming a conductive base on the ground wire, arranging the middle portion of the probe needle on the conductive base so that the probe needle has a cantilever structure, and covering the middle portion of the probe needle with a conductive material.

Another aspect of the present invention is a method for manufacturing a probe card. The method includes preparing a substrate including a support and a ground wire, preparing a probe needle including a first end portion, a second end portion, and a middle portion covered by an insulative material, attaching the probe needle to the substrate so that the first end portion of the probe needle is held by the support and the probe needle has a cantilever structure, covering the second end portion of the probe needle with an insulative resin, and arranging conductive material covering the middle portion of the probe needle and connected to the ground wire, between the support and the insulative resin.

A further aspect of the present invention is a probe card including a substrate and a plurality of probe needles attached to the substrate, with each one of the probe needles having a coaxial structure.

Another aspect of the present invention is a probe card including a substrate, a ground wire formed on the substrate, a conductive material connected to the ground wire, and a plurality of probe needles attached to the substrate and having a cantilever structure, each probe needle includes a middle portion covered with an insulative tube and embedded in the conductive material.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
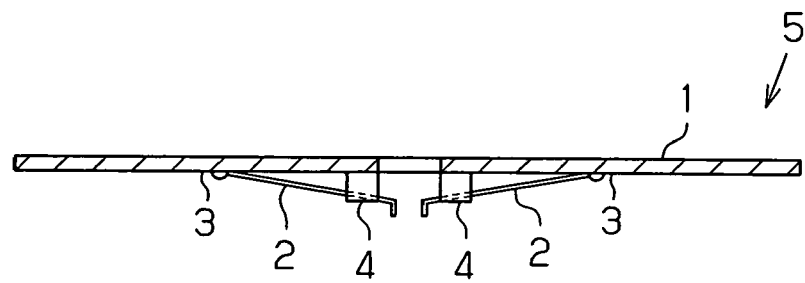
FIG. 1 is a cross-sectional diagram of a probe card in the prior art.
Figure 2:
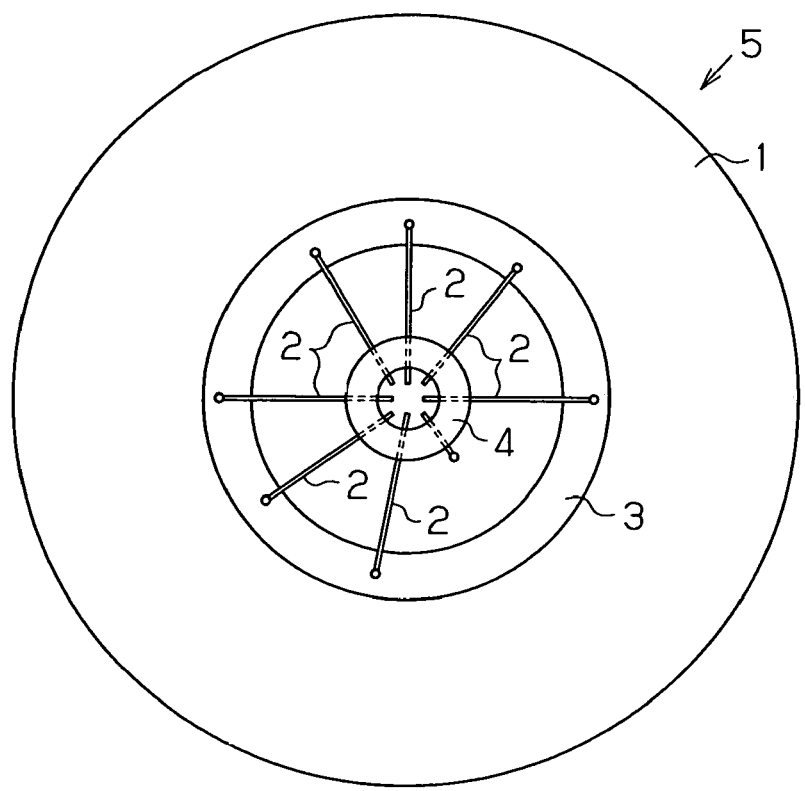
FIG. 2 is a plan view showing the probe card of FIG. 1.

In the drawings, like numerals are used for like elements throughout.

[First Embodiment]

Figure 3:
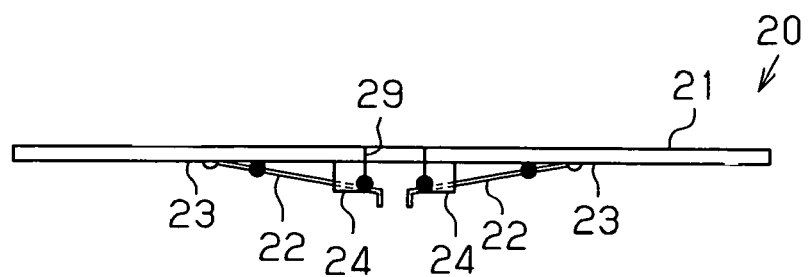
FIG. 3 is a cross-sectional diagram of a probe card according to a first embodiment of the present invention.
Figure 4:
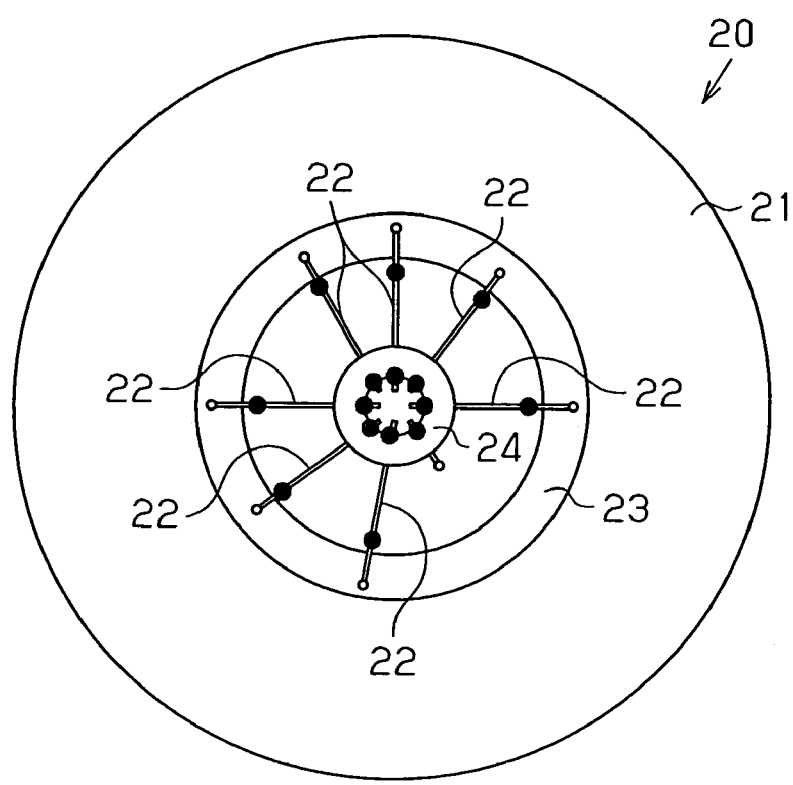
FIG. 4 is a plan view showing the probe card of FIG. 3.

A probe card 20 according to a first embodiment of the present invention will now be described with reference to the drawings. As shown in FIGS. 3 and 4, the probe card 20 includes a disk-shaped substrate 21. A hole 29 extends through the central portion of the substrate 21. The substrate 21 includes a needle seat 23 and a support 24, which is made of synthetic resin and is located inward from the needle seat 23 and around the hole 29. A plurality of probe needles 22 extend outward in the radial direction from the central portion of the substrate 21.

Each probe needle 22 has a basal portion soldered to the needle seat 23 and a distal portion held by the support 24. The distal portions of the probe needles 22 are concentrated at the central portion of the substrate 21. Each probe needle 22 has a cantilever structure in which it becomes farther from the substrate 21 toward its distal end.

Figure 5:
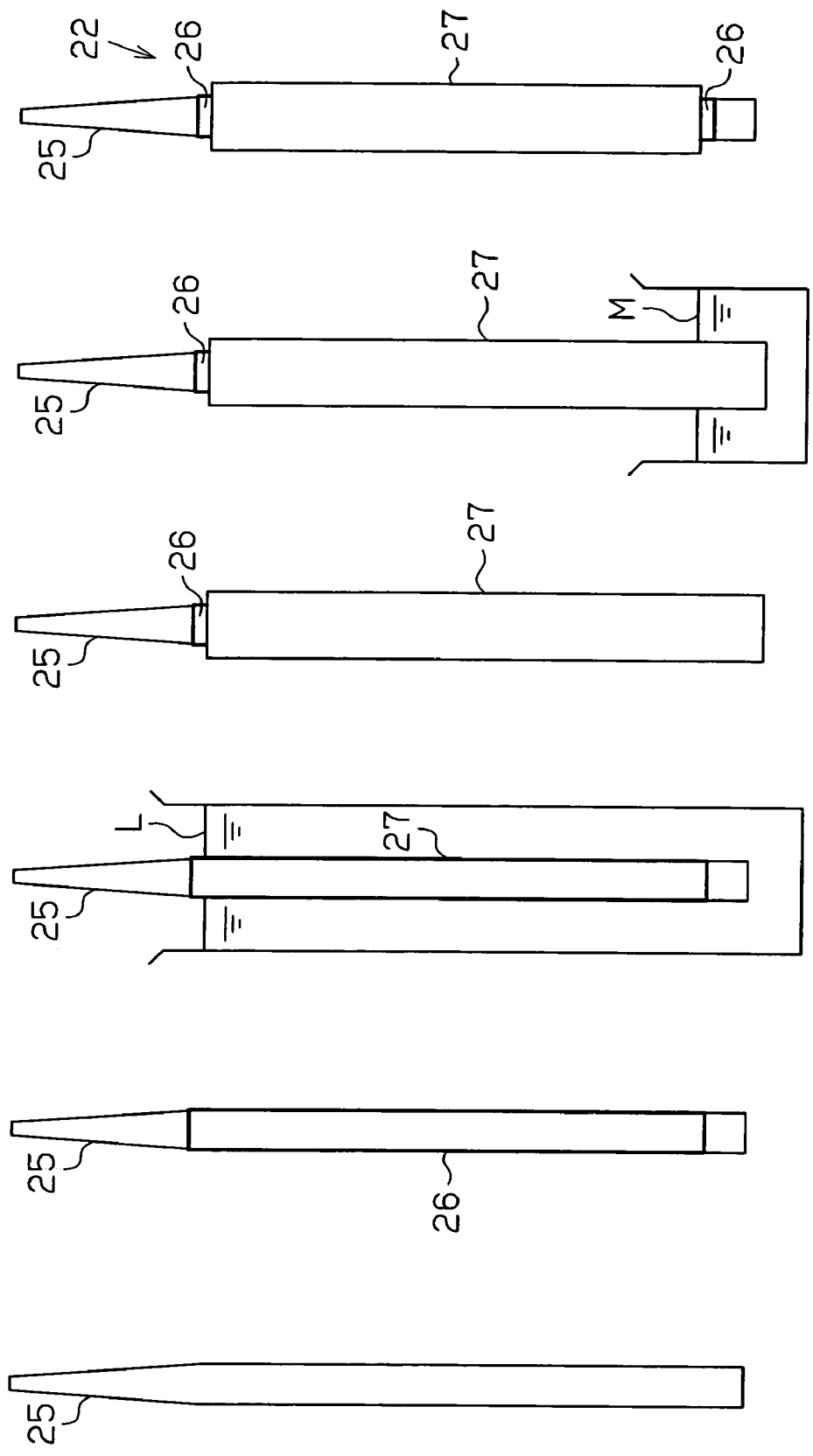
FIGS. 5A to 5F are diagrams showing the procedures for manufacturing a probe needle included in the probe card of FIG. 3.

The structure of the probe needle 22 and the method for manufacturing the probe needle 22 will now be described with reference to FIGS. 5A to 5F. Referring to FIG. 5A, the probe needle 22 has a central conductive body 25, which is made of tungsten and has a diameter of approximately 130 µm. The central conductive body 25 has a tapered distal end portion.

Referring to FIG. 5B, the central conductive body 25 has a middle portion covered by an electrically insulative material, or insulative tube 26. The diameter of the insulative tube 26 is approximately 150 µm.

Then, referring to FIG. 5C, excluding the part of the insulative tube 26 located on the distal end portion of the central conductive body 25, the central conductive body 25 and the insulative tube 26 are immersed in a solvent L. The solvent L is a one-component normal temperature curing type silver conductive adhesive. More specifically, using high polymer acrylic resin as a binder, fine flakes of silver powder, which is a conductive substance, is kneaded with a solvent such as ethyl acetate or butyl acetate and then dispersed to produce the solvent L.

Subsequently, the central conductive body 25 is taken out of the solvent L and dried. This forms a conductive layer 27 that covers the insulative tube 26 and has a thickness of approximately 10 µm. The thickness of the conductive layer 27 may be adjusted by changing the temperature of the solvent L, the viscosity of the solvent L based on the composition (ratio) of the conductive substance and the solvent, the speed for taking the central conductive body 25 out of the solvent L, and the temperature and humidity when drying the central conductive body 25.

Next, the basal portion of the central conductive body 25 is immersed in a solvent M that does not include the above conductive substance. This removes the conductive layer 27 from the basal portion of the central conductive body 25 and exposes part of the insulative tube 26. These procedures form the probe needle 22 with a coaxial structure. The diameter of the probe needle is approximately 170 µm.

Figure 6:
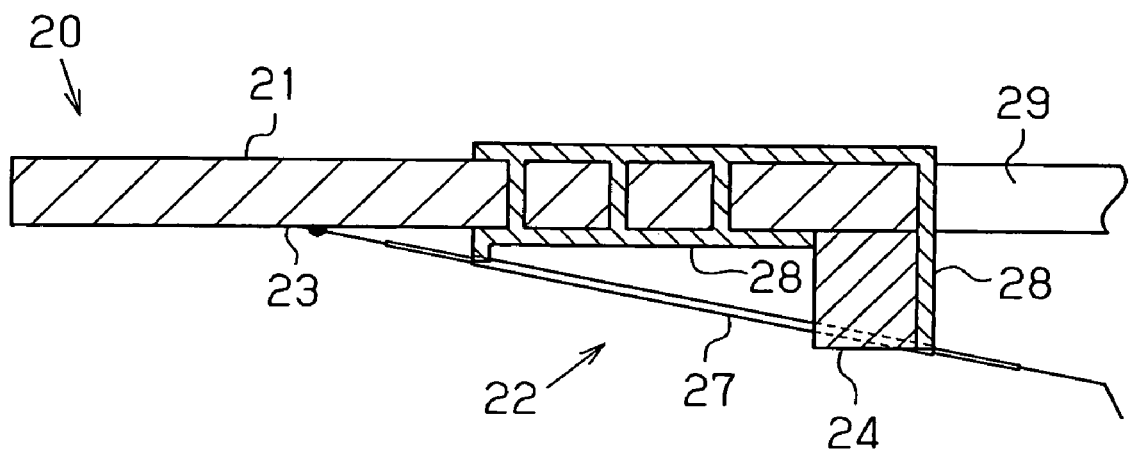
FIG. 6 is a cross-sectional showing the probe card of FIG. 3 in detail.

The probe needle 22 is attached to the substrate 21 as shown in FIG. 6. The substrate 21 includes a ground wire 28. The distal portion of the probe needle 22 is attached to the support 24, and the support 24 is attached to the substrate 21. The basal portion of the probe needle 22 is soldered to the substrate 21. Further, the two ends of the conductive layer 27 are soldered to or adhered with a conductive adhesive to the ground wire 28.

The ground wire 28 is a copper foil adhered to the substrate 21 from the hole 29 in the central portion of the substrate 21 to the side of the support 24. The ground wire 28 extends to the vicinity of the distal end of the conductive layer 27 and connects to the distal portion of the conductive layer 27.

The above method for manufacturing the probe needle 22 has the advantages described below.

(1) The probe needle 22, which has a coaxial structure, has about the same diameter as a normal probe needle, which is covered by the insulative tube 26.

(2) Since the probe needle 22 with the coaxial structure has about the same diameter as the normal probe, all of the probe needles 22 attached to the probe card 20 may have a coaxial structure.

(3) All of the probe needles 22 attached to the substrate 21 have a coaxial structure. Thus, the probe card 20 is only subtly affected by noise.

(4) The probe needles 22 with the coaxial structure have about the same diameter as the normal probe needles. Thus, the probe needles 22 may be attached to the substrate 21 using the same attachment rules as the normal probe needles. This facilitates the assembly of the probe card 20.

[Second Embodiment]

Figure 7:
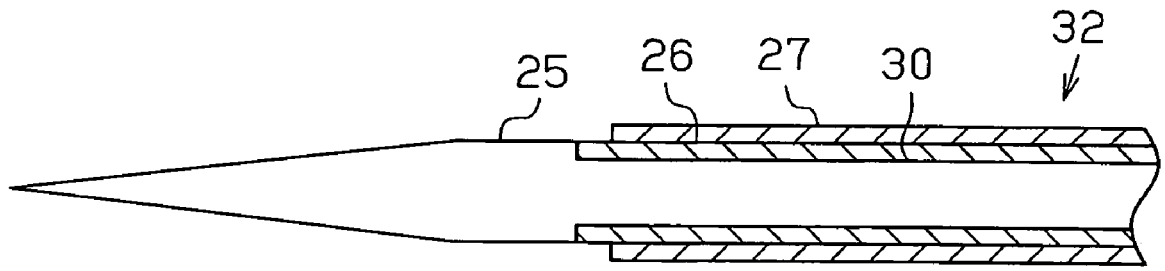
FIG. 7 is a cross-sectional diagram of a probe needle according to a second embodiment of the present invention.

FIG. 7 shows a probe needle 32 according to a second embodiment of the present invention. In the second embodiment, part of the central conductive body 25 that is covered by the insulative tube 26 has a reduced diameter. This part is referred to as a reduced diameter portion 30. As a result, the diameter of the probe needle 32 is reduced.

More specifically, if the thickness of the conductive layer 27 is approximately 10 µm in the same manner as in the first embodiment, the reduced diameter portion 30 covered by the insulative tube 26 has a diameter reduced by approximately 20 µm from the other portions of the central conductive body 25.

Accordingly, in the second embodiment, the probe needle 32 covered by the insulative tube 26 and the conductive layer 27 has about the same diameter as the prior art probe needle covered by only the insulative tube. Accordingly, the probe needle 32 is attached to a substrate with the same needle attachment rules as the probe needles of the prior art.

The diameters of the probe needle 32 at the portion fixed to the support 24 and at the distal portion remain unchanged. Thus, the probe needle 32 has about the same durability, needle pressure, and contact characteristics as the prior art probe.

[Third Embodiment]

A probe card 40 according to a third embodiment of the present invention will now be described with reference to the drawings.

Figure 8:
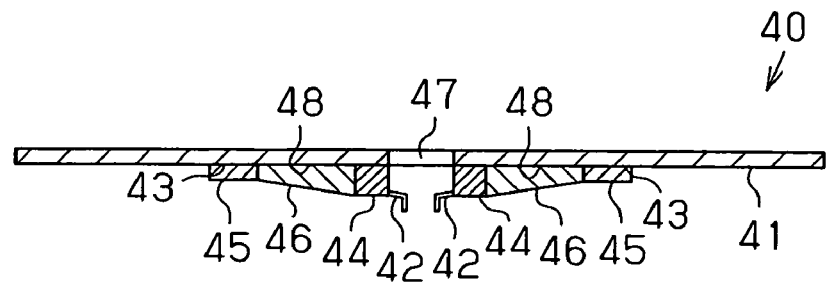
FIG. 8 is a cross-sectional diagram showing a probe card according to a third embodiment of the present invention.
Figure 9:
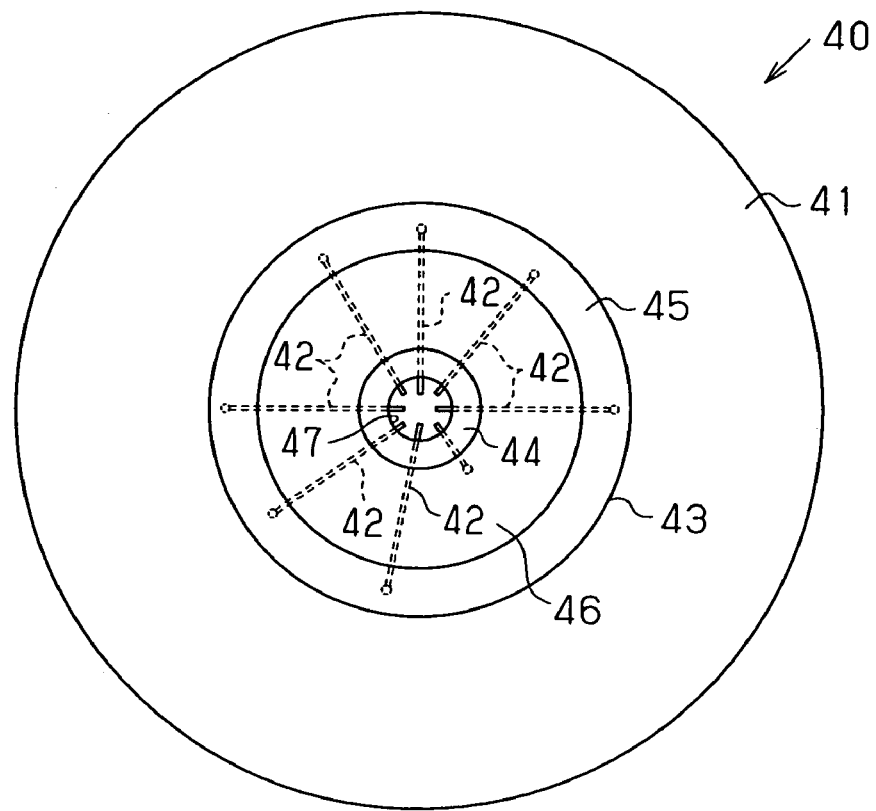
FIG. 9 is a plan view showing the probe card of FIG. 8.

As shown in FIGS. 8 and 9, the probe card 40 includes a disk-shaped substrate 41. A hole 47 extends through the central portion of the substrate 41. The substrate 41 includes a needle seat 43 and a support 44, which is made of synthetic resin and is located inward from the needle seat 43 and around the hole 47. A plurality of probe needles 42 extend outward in the radial direction from the central portion of the substrate 41. Each probe needle 42 has a cantilever structure in which it becomes farther from the substrate 41 toward its distal end.

Each probe needle 42 has a basal portion soldered to the needle seat 43 and a distal portion held by the support 44. The distal portions of the probe needles 42 are concentrated at the central portion of the substrate 41.

The soldered basal end of each probe needle 42 is covered by an insulative resin 45. The portion of the probe needle 42 between the insulative resin 45 and the support 44 is covered by a conductive adhesive 46. The conductive adhesive 46 is a one-component normal temperature curing type silver conductive adhesive. More specifically, using high polymer acrylic resin as a binder, fine flakes of silver powder are kneaded with a solvent and then dispersed to produce the conductive adhesive 46.

Figure 10:
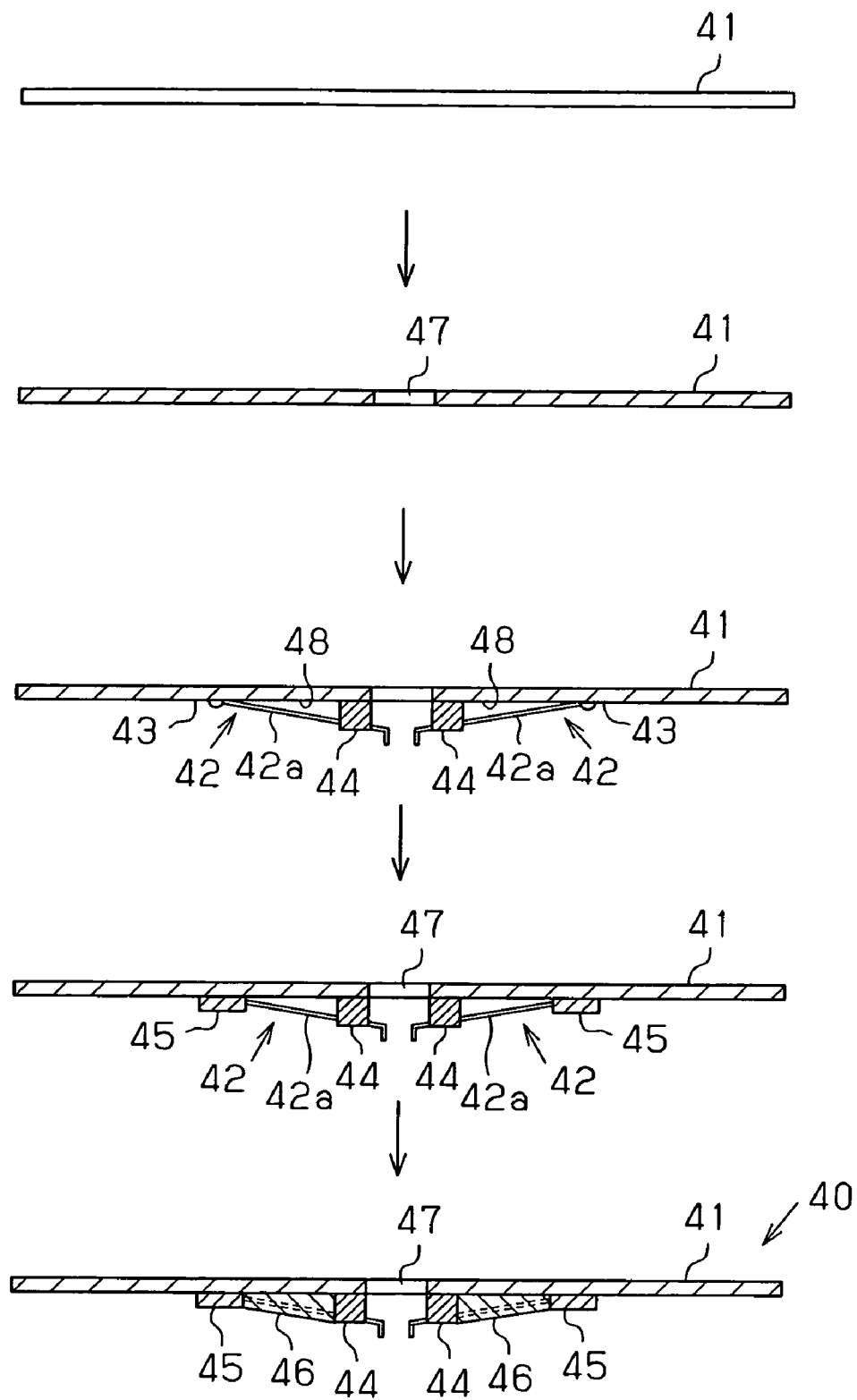
FIG. 10 is a schematic diagram showing the procedures for manufacturing the probe card of FIG. 8.

The procedures for manufacturing the probe card will now be described with reference to FIG. 10.

The hole 47 is first formed in the central portion of a substrate 41 that has not been processed yet. Afterwards, a ground wire 48 is formed around the hole 47. The probe needles 42 are then attached to the substrate 41 around the hole 47 in accordance with normal needle attachment rules. That is, the probe needles 42 are arranged at predetermined intervals extending outward in the radial direction about the hole 47. The basal portion of each probe needle 42 is soldered to the needle seat 43. Further, the distal portion of each probe needle 42 is held by the support 44.

More specifically, the ground wire 48 is formed on part of the surface of the substrate 41 between the needle seat 43 and the support 44. Part of the probe needle 42 between the soldered portion and the support 44 is covered beforehand by an insulative tube 42a.

Then, the soldered basal portion of the probe needle 42 is covered by the insulative resin 45. A conductive flux, or the conductive adhesive 46, fills the space between the insulative resin 45 and the support 44 to cover the probe needle 42. The conductive adhesive 46 is then dried.

As a result, referring to FIG. 8, the part of the probe needle 42 between the insulative resin 45 and the support 44 is covered by the conductive adhesive 46. The conductive adhesive 46 is connected to the ground wire 48.

Accordingly, the portion of each probe needle 42 between the insulative resin 45 and the support 44 has substantially the same structure as a probe needle having a coaxial structure.

The probe card 40 has the advantages described below.

(1) The portion of each probe needle 42 between the insulative resin 45 and the support 44 has substantially the same structure as a probe needle having a coaxial structure. Accordingly, the same noise reduction effect as a probe needle having a coaxial structure is obtained.

(2) The probe needle 42 is a normal probe needle covered only by the insulative tube 42a. However, all of the probe needles 42 have the same structure as a probe needle having a coaxial structure. Accordingly, the probe card 40 is only subtly affected by noise.

(3) The probe needle 42 is attached to the substrate 41 in accordance with the same needle attachment rules as in the prior art. Accordingly, the assembly of the probe card 40 is facilitated.

[Fourth Embodiment]

Figure 11:
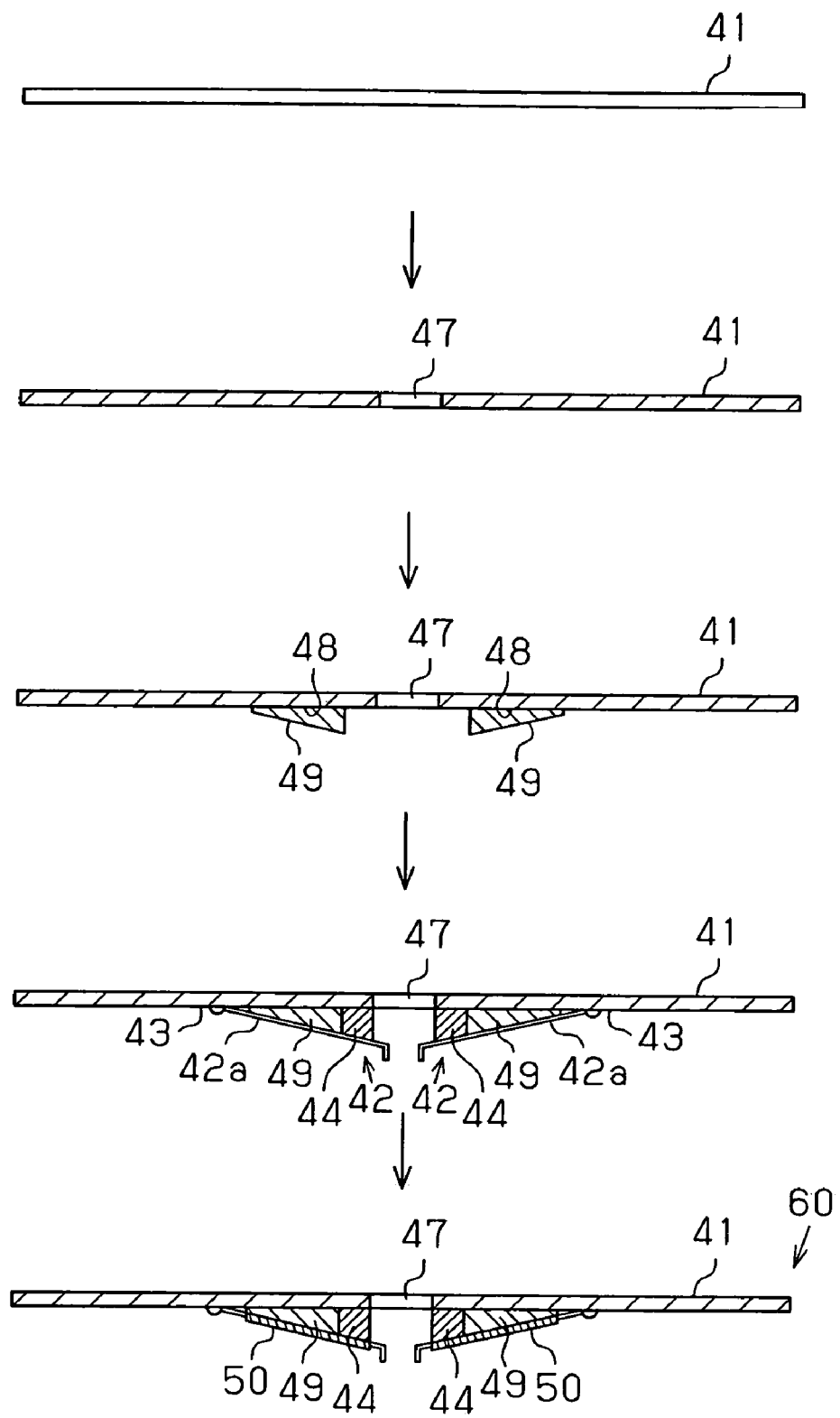
FIG. 11 is a schematic diagram showing the procedures for manufacturing a probe card according to a fourth embodiment of the present invention.

FIG. 11 shows the procedures for manufacturing a probe card 60 according to a fourth embodiment of the present invention.

A hole 47 is first formed in the central portion of a substrate 41 that has not been processed yet. Afterwards, a ground wire 48 is formed around the hole 47, and a conductive base 49 is formed on the ground wire 48. The conductive base 49 may be a conductive rubber plate or a metal plate. The conductive base 49 has a sloped surface (lower surface as viewed in FIG. 11) that approaches the substrate 41 as the peripheral portion of the substrate 41 becomes closer.

Each probe needle 42 is arranged along the sloped surface of the conductive base 49. The basal portion of the probe needle 42 is soldered to the needle seat 43 of the substrate 41. The portion of the probe needle 42 between the soldered portion and the support 44 is covered beforehand by the insulative tube 42a. The soldered portion of the probe needle 42 does not have to be covered by an insulative resin.

A conductive adhesive 50 is applied so as to cover the probe needle 42. Thus, the probe needle 42 is embedded between the conductive adhesive 50 and the conductive base 49.

The portion of the probe needle 42 between the soldered portion and the support 44 is covered by the conductive base 49 and the conductive adhesive 50.

Accordingly, the structure of the portion between the soldered portion and the support 44 in each probe needle 42 is substantially the same as a probe needle having a coaxial structure. The probe card 60 of the fourth embodiment has the same advantages as the probe card 40 of the third embodiment.

It should be apparent to those skilled in the art that the present invention may be embodied in many other specific forms without departing from the spirit or scope of the invention. Particularly, it should be understood that the present invention may be embodied in the following forms.

The conductive layer 27 may be formed by applying a solvent, in which a conductive substance is mixed, around the insulative tube 26, and then drying the solvent.

The conductive layer 27 may be formed by performing vapor deposition to laminate a conductive substance around the insulative tube 26.

In the third embodiment, a conductive flux other than the conductive adhesive 46 may fill the space between the insulative resin 45 and the support 44 and then be dried. Further, the conductive flux may be a sol or gel of conductive rubber or may be a solvent in which a conductive substance is mixed.

The solvent L of the first embodiment or the conductive substance used in the conductive fluid of the other embodiments may be copper, a copper alloy, silver, nickel, tin, lead, zinc, iron, phosphorus, silicon, chromium, bismuth, cadmium, titanium, magnesium, aluminum, arsenic, antimony, molybdenum, cobalt, fine grains of an alloy having a low fusion point such as solder, fine grains of metal oxides such as zinc oxide and indium oxide, various types of carbon black, conductive polymer grains such as polypyrrole or polyaniline, polymer fine grains covered with metal, copper or silver fine grains covered with a rare metal, metal fibers, and carbon fibers.

In the fourth embodiment, the conductive base 49 may be a sol or gel of conductive rubber or may be a conductive adhesive. A probe needle 42 may be embedded in the conductive base 49.

In the fourth embodiment, the conductive base 49 may have a height that avoids interference with the probe needles 42 during attachment of the probe needles 42. That is, the conductive base 49 may be lower than as shown in FIG. 11. In this case, the conductive adhesive is applied after attachment of the probe needles 42 to fill the space between the probe needles 42 and the conductive base 49.

The present examples and embodiments are to be considered as illustrative and not restrictive, and the invention is not to be limited to the details given herein, but may be modified within the scope and equivalence of the appended claims.

What is claimed is:

1. A method for manufacturing a probe needle having a coaxial structure, the method comprising:
   preparing a central conductive body including a reduced diameter portion having a diameter smaller than that of other portions of the central conductive body;
   covering the reduced diameter portion of the central conductive body with an insulative tube; and
   forming a conductive layer around the insulative tube by superimposing a film of fine conductive grains around the insulative tube.

2. The method of claim 1, wherein the conductive layer has a thickness of about 5–10 µm.

3. A method for manufacturing a probe needle having a coaxial structure, the method comprising:
   preparing a central conductive body including a reduced diameter portion having a diameter smaller than that of other portions of the central conductive body;
   covering the reduced diameter portion of the central conductive body with an insulative tube; and
   forming a conductive layer around the insulative tube by applying a solvent, in which a conductive substance is mixed, around the insulative tube.

4. A method for manufacturing a probe needle having a coaxial structure, the method comprising:
   preparing a central conductive body including a reduced diameter portion having a diameter smaller than that of other portions of the central conductive body;
   covering the reduced diameter portion of the central conductive body with an insulative tube; and
   forming a conductive layer around the insulative tube by performing vapor deposition to superimpose a conductive substance around the insulative tube.

5. The method of claim 4, wherein the conductive layer has a thickness of about 5–10 μm.

6. A method for manufacturing a probe needle having a coaxial structure, the method comprising:

covering a central conductive body with an insulative tube, wherein the insulative tube includes a first end portion and a second end portion that are not covered by the insulative tube; and forming a conductive layer around the insulative tube and the second end portion, said forming a conductive layer including immersing the central conductive body in a first solvent containing a conductive substance excluding the first end portion, taking out the central conductive body from the first solvent, drying the central conductive body; and removing a portion of the conductive layer on the second end portion of the insulative tube with a second solvent.

7. The method according to claim 6, wherein the first solvent includes silver grains and a high polymer acrylic resin.

* * * * *